United States Patent

Kurusu et al.

Patent Number: 5,949,287
Date of Patent: Sep. 7, 1999

[54] POWER AMPLIFIER

[75] Inventors: Hitoshi Kurusu; Yoshihiro Tsukahara, both of Tokyo, Japan

[73] Assignee: Mitsubishi Denki Kabushiki Kaisha, Tokyo, Japan

[21] Appl. No.: 09/054,525

[22] Filed: Apr. 3, 1998

[30] Foreign Application Priority Data

Sep. 19, 1997 [JP] Japan .................................. 9-254715

[51] Int. Cl.⁶ ..................................................... H03F 3/16
[52] U.S. Cl. ........................................... 330/277; 330/295
[58] Field of Search .................................. 330/295, 277, 330/302, 51

[56] References Cited

U.S. PATENT DOCUMENTS

| | | | |
|---|---|---|---|
| 4,788,511 | 11/1988 | Schindler | 330/277 |
| 4,853,649 | 8/1989 | Seino et al. | 330/277 |
| 5,177,381 | 1/1993 | Friesen et al. | 307/492 |
| 5,208,547 | 5/1993 | Schindler | 330/54 |
| 5,420,541 | 5/1995 | Upton et al. | 330/286 |
| 5,541,554 | 7/1996 | Stengel et al. | 330/51 |
| 5,694,085 | 12/1997 | Walker | 330/295 |

FOREIGN PATENT DOCUMENTS

| | | |
|---|---|---|
| 4154216 | 5/1992 | Japan . |
| 786909 | 3/1995 | Japan . |

Primary Examiner—Robert Pascal
Assistant Examiner—Henry Choe
Attorney, Agent, or Firm—Leydig, Voit & Mayer, Ltd

[57] ABSTRACT

In a power amplifier including an input matching circuit; an output matching circuit; and first and second transistors receiving a gate bias and a drain bias, the transistors having the same pinch-off voltage and being connected in parallel; resistors connected to the gates of the transistors, grounding the gate of the transistors. The resistances of the resistors are set so that when the output power increases proportionally to the input power, a gate bias applied to the first transistor exceeds the pinch-off voltage to the first transistor is ON white the gate bias applied to the second transistor does not exceed the pinch-off voltage and is OFF, and when the output power does not increase proportionally to the input power, the gate bias applied to the second transistor exceeds the pinch-off voltage of the second transistor so that both of the first and second transistors are ON. The power amplifier produces constant output power levels with respect to a wide range of input power levels.

4 Claims, 3 Drawing Sheets

POWER AMPLIFIER

FIELD OF THE INVENTION

The present invention relates to a power amplifier that is employed in a transmitter, such as an antenna device, and, more particularly, to a power amplifier that can produce constant output power with respect to a wide range of input power levels.

BACKGROUND OF THE INVENTION

As shown in FIG. 8, an antenna device includes an antenna unit 43, a directional coupler 42, a receiving unit 40, a transmitting unit comprising power amplifiers 32 and 37 and attenuators (ATTs) 38 and 39, and a switch 41 for switching transmit/receive. The attenuators (ATTs) 38 and 39 are connected to the inputs of the power amplifiers 32 and 37, respectively. An input power passes through the attenuator (ATT) 39 and is amplified by the power amplifier 37 and, then, the amplified input power passes through the attenuator (ATT) 38 and is amplified by the power amplifier 32, to be transmitted to the antenna unit 43 as an output power.

As shown in FIG. 9, the power amplifier 32 includes an input matching circuit 9 connected to an input terminal 11, an output matching circuit 10 connected to an output terminal 12, and a transistor 33 connected between these matching circuits. The gate of the transistor 33 is connected to a gate bias terminal 35, and the drain thereof is connected to a drain bias terminal 36. Further, coils 29 and 31 for cutting off RF components are connected to the gate bias terminal 35 and the drain bias terminal 36, respectively.

Generally, in order that an antenna device realizes accurate detection of a specified object, it is necessary to make an output power of a transmitting unit constant. Especially in an array antenna device in which a plurality of antenna devices shown in FIG. 8 are arranged, when the transmission levels of the respective antenna devices are not constant, the whole transmission level of the array antenna device is unstable.

As to the power characteristics of the transistor in the power amplifier 32, as shown by a curve 16 in FIG. 7, when input power $P_{in}$ is lower, output power $P_{out}$ increases proportionally to the input power $P_{in}$, and when the input power $P_{in}$ becomes higher, the output power $P_{out}$ attains maximum value at an input power value. Accordingly, the power amplifier 32 has such power characteristics as well. Consequently, the output power $P_{out}$ varies with variations in the input power $P_{in}$ according to frequency characteristics and the temperature. For this reason, in the conventional device, as shown in FIG. 8, the attenuator (ATT) 38 is connected to the input of the power amplifier 32 to adjust the level of the input power $P_{in}$. However, in the device in which the attenuator (ATT) 38 adjusts the input power $P_{in}$, it is difficult to make the output powers constant with respect to a wide range of the extensive input power levels.

In addition, in order to make the sensitivity of the antenna device better, the antenna device is usually used at the maximum output level of the transmitting unit. Therefore, the input power $P_{in}$ of the power amplifier 32 is set to a value at which the output power $P_{out}$ is maximum. The power added efficiency of the power amplifier 32 is obtained from a formula: (output power $P_{out}$—input power $P_{in}$)/power of drain bias. This power added efficiency decreases, as shown by a curve 19 in FIG. 7, rapidly when the input power $P_{in}$ is excessive input, i.e., when the input power $P_{in}$ exceeds a region where the output power $P_{out}$ is maximum. Consequently, the power added efficiency significantly decreases when the input power $P_{in}$ is excessive input, so that the consumption power of the power amplifier increases.

SUMMARY OF THE INVENTION

It is an object of the present invention to provide a power amplifier that can produce constant output power with respect to excessive input power levels.

Another object of the present invention is to provide a power amplifier that can produce a high power added efficiency even when an input power is excessively input.

Other objects and advantages of the present invention will become apparent from the detailed description given hereinafter; it should be understood, however, that the detailed description and specific embodiment are given by way of illustration only, since various changes and modifications within the scope of the invention will become apparent to those skilled in the art from this detailed description.

According to a first aspect of the present invention, in a power amplifier including a transistor having a gate connected to an input matching circuit and a drain connected to an output matching circuit, a gate bias being applied to the gate of the transistor and a drain bias being applied to the drain of the transistor, the transistor amplifying an input power that is supplied from the input matching circuit to transmit the amplified power to the output matching circuit as an output power, at least two transistors having the same pinch-off voltage are connected in parallel, resistors are connected to gates of the transistors, and the gates of the transistors are grounded through the resistors; and the resistance values of the resistors are set as follows: in a region of the power characteristic of the transistor where the output power increases proportionally to an increase in the input power, i.e., in the low input power state, a gate bias applied to at least one transistor exceeds the pinch-off voltage of the transistor and the transistor is in the ON state, and a gate bias applied to at least one transistor does not exceed the pinch-off voltage of the transistor and the transistor is in the OFF state; and in the vicinity of a region of the power characteristic of the transistor where the output power is maximum, i.e., in the high input power state, the gate bias applied to the transistor in the OFF state exceeds the pinch-off voltage of the transistor and all of the transistors are in the ON state. Therefore, the transistor that is in the CUFF state at the low input power operates at the high input power as well, whereby the amount corresponding to the reduced output power of the transistor that has been in the ON state is compensated by the operation of the transistor. Consequently, the output power is constant even at the high input power. As a result, a power amplifier that can produce constant output power levels with respect to extensive input power levels can be obtained.

According to a second aspect of the present invention, in the power amplifier of the first aspect of the invention, the resistance values of the resistors connected to the gates of the transistors are set to large values so that when the input power exceeds the region of the power characteristic of the transistor where the output power is maximum, i.e., when the input power is excessively input, gate current flowing from the drain bias to the gate bias through the transistor in the ON state is suppressed. Therefore, when the input power is excessively input, the gate current flowing from the drain bias to the gate bias through the transistor in the ON state is suppressed, whereby loss of the power at the drain bias is prevented. Consequently, a high power added efficiency can be produced even when the input power is excessively input.

According to a third aspect of the present invention, in a power amplifier including a transistor having a gate connected to an input matching circuit and a drain connected to an output matching circuit, a gate bias being applied to the gate of the transistor and a drain bias being applied to the drain of the transistor, the transistor amplifying an input power that is supplied from the input matching circuit to transmit the amplified power to the output matching circuit as an output power, at least two transistors having different pinch-off voltages are connected in parallel, and resistors are connected to gates of the transistors; and the resistance values of the resistors are set as follows: in a region of the power characteristic of the transistor where the output power increases proportionally to an increase in the input power, i.e., in the low input power state, a gate bias applied to at least one transistor exceeds the pinch-off voltage of the transistor and the transistor is in the ON state, and a gate bias applied to at least one transistor does not exceed the pinch-off voltage of the transistor and the transistor is in the OFF state; and in the vicinity of a region of the power characteristic of the transistor where the output power is maximum, i.e., in the high input power state, the gate bias applied to the transistor in the OFF state exceeds the pinch-off voltage of the transistor and all of the transistors are in the ON state. Therefore, the transistor that is in the OFF state at the low input power operates at the high input power as well, whereby the amount corresponding to the reduced output power of the transistor that has been in the ON state is compensated by the operation of the transistor. Consequently, the output power is constant even at the high input power. As a result, a power amplifier that can produce constant output power levels with respect to extensive input power levels can be obtained.

According to a fourth aspect of the present invention, in the power amplifier of the third aspect of the invention, the resistance values of the resistors connected to the gates of the transistors are set to large values so that when the input power exceeds the region of the power characteristic of the transistor where the output power is maximum, i.e., when the input power is excessively input, gate current flowing from the drain bias to the gate bias through the transistor in the ON state is suppressed. Therefore, when the input power is excessively input, the gate current flowing from the drain bias to the gate bias through the transistor in the ON state is suppressed, whereby loss of the power at the drain bias is prevented. Consequently, a high power added efficiency can be produced even when the input power is excessively input.

DETAILED DESCRIPTION OF THE PREFERRED EMBODIMENTS

Embodiment 1.

Figure 1:
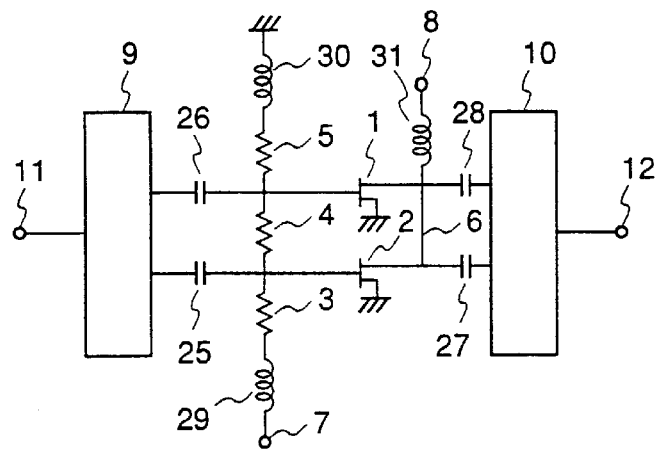
FIG. 1 is a circuit diagram illustrating a power amplifier according to first embodiment of the present invention.

FIG. 1 is a circuit diagram illustrating a power amplifier according to a first embodiment of the present invention.

As shown in FIG. 1, the power amplifier according to the first embodiment includes an input matching circuit 9, an output matching circuit 10, and two transistors 1 and 2 that are connected in parallel between the matching circuits 9 and 10. The transistors 1 and 2 have the same pinch-off voltage. This pinch-off voltage is defined as gate bias $V_g$ at a point at which drain current $I_{ds}$ is 0 under appropriate drain bias $V_{ds}$.

The gates of the transistors 1 and 2 are connected to resistors 4 and 3, respectively. An end of the resistor 3 is connected to an end of the resistor 4, and the other end of the resistor 3 is connected to a gate bias terminal 7. The other end of the resistor 4 is connected to an end of a resistor 5. The other end of the resistor 5 is connected to a ground. That is, the gates of the transistors 1 and 2 are grounded through the resistor 5. Coils 29 and 30 for cutting off RF components are connected between the resistor 3 and the gate bias terminal 7 and between the resistor 5 and the ground, respectively. Further, the gates of the transistors 1 and 2 are connected to the input matching circuit 9. Capacitors 25 and 26 for cutting off DC components in the gate biases are connected between the transistors 2 and 1 and the input matching circuit 9, respectively. The input matching circuit 9 is connected to an input terminal 11 for supplying an input power.

The drains of the transistors 1 and 2 are connected to a low-resistance wire 6. An end of the low-resistance wire 6 is connected to a drain bias terminal 8. A coil 31 for cutting off RF components is connected between the drain bias terminal 8 and the low-resistance wire 6. Further, the drains of the transistors 1 and 2 are connected to the output matching circuit 10. Capacitors 27 and 28 for cutting off DC components in the drain biases are connected between the transistors 2 and 1 and the output matching circuit 10, respectively. The output matching circuit 10 is connected to an output terminal 12 for outputting an output power.

The sources of the transistors 1 and 2 are respectively grounded.

In addition, the power amplifier with the construction described above is fabricated by laminating desired semiconductor layers on a semiconductor substrate comprising GaAs or the like.

Figure 2:
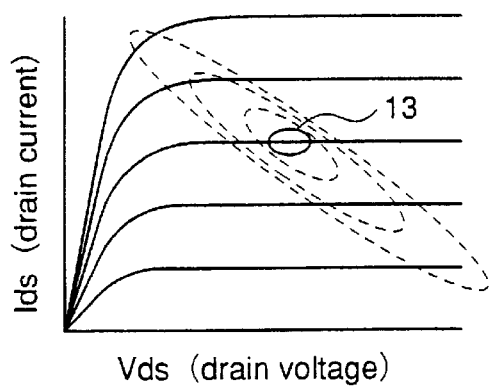
FIG. 2 is a graph showing current and voltage characteristics of a first transistor shown in FIG. 1.
Figure 3:
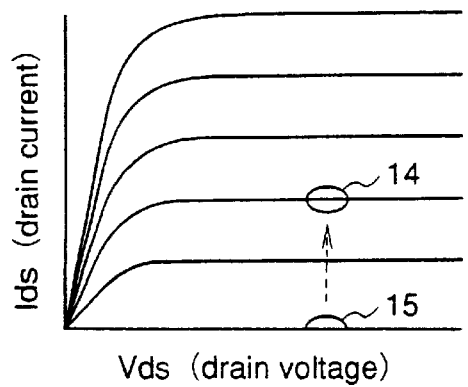
FIG. 3 is a graph showing current and voltage characteristics of a second transistor 2 shown in FIG. 1.
Figure 4:
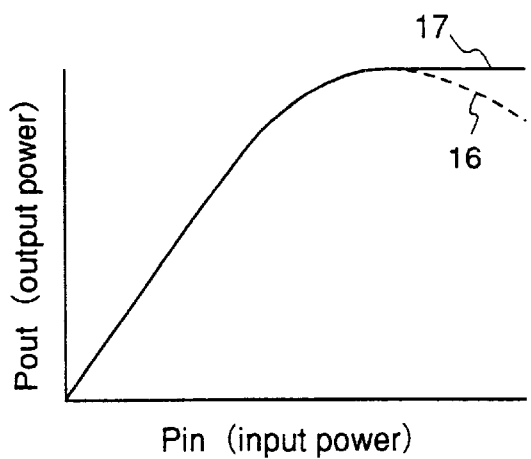
FIG. 4 is a graph showing input power and output power characteristics of power amplifiers according to first and third embodiments of the present invention.

A description is given of the operation of the power amplifier according to the first embodiment, with reference to FIGS. 2 to 4.

Assuming that the resistance values of the resistors 3, 4 and 5 are $R_a$, $R_b$ and $R_c$, respectively, and the voltage of the gate bias terminal 7 is $-V_{gg}$, the gate bias $V_{ga}$ of the transistor 1 is obtained from the following formula (1).

$$V_{ga} = -R_c \cdot V_{gg} / (R_a + R_b + R_c) \qquad (1)$$

The gate bias $V_{gb}$ of the transistor 2 is obtained from the following formula (2).

$$V_{gb} = -(R_b + R_c) V_{gg} / (R_a + R_b + R_c) \quad (2)$$

The resistance values $R_a$, $R_b$ and $R_c$ of the resistors 3, 4 and 5 are set so that the pinch-off voltages $V_p$ of the transistors 1 and 2 are between the gate bias $V_{ga}$ of the transistor 1 and the gate bias $V_{gb}$ of the transistor 2. That is, the resistance values $R_a$, $R_b$ and $R_c$ of the resistors 3, 4 and 5 are set to values that realize the relationship of $V_{ga} > V_p > V_{gb}$ in the formulae (1) and (2). For example, when the voltage of the gate bias terminal 7 is $-6.5$ V ($V_{gg} = 6.5$) and the pinch-off voltages $V_p$ of the transistors 1 and 2 are $-3.0$ V, the resistance values $R_a$, $R_b$ and $R_c$ of the resistors 3, 4 and 5 are set to 10Ω, 20Ω and 10Ω, respectively. At low input power, the operating point of the transistor 1 is in the vicinity of a region 13 shown in FIG. 2. The operating point of the transistor 2 is in the vicinity of a region 14 shown in FIG. 3. Therefore, since the gate bias $V_{ga}$ applied to the transistor 1 is higher than the pinch-off voltage $V_p$ of the transistor 1, the transistor 1 is in the ON state. Since the gate bias $V_{gb}$ applied to the transistor 2 is lower than the pinch-off voltage $V_p$ of the transistor 2, the transistor 2 is in the OFF state.

Figure 7:
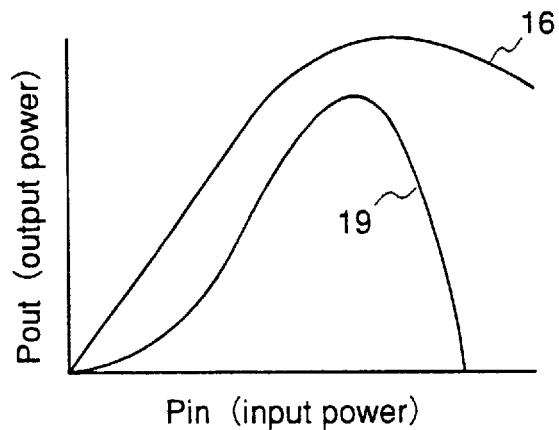
FIG. 7 is a graph showing input power and output power characteristics and power added efficiency characteristics of a conventional power amplifier.
Figure 8:
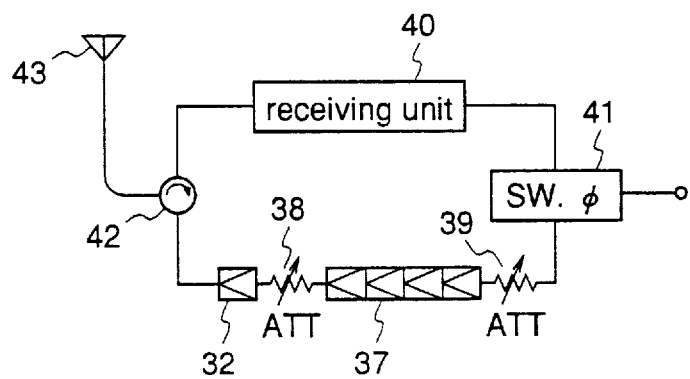
FIG. 8 is a block diagram illustrating a conventional antenna device including transmitting/receiving systems with attenuators.
Figure 9:
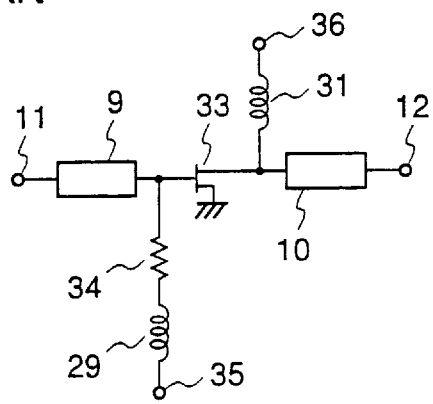
FIG. 9 is a circuit diagram illustrating a conventional power amplifier.

The input power has a frequency and a constant amplitude. Accordingly, the operating point 13 of the transistor 1 oscillates in a range shown by each dotted line in FIG. 2, according to the amplitude of the input power. When the input power is high, the amplitude of the input power is large, and the operating point 13 of the transistor 1 oscillates in a range of the widest region that is shown by the dotted line in FIG. 2. Since the input power $P_{in}$ is set so that the output power $P_{out}$ is maximum, as is known from the curve 16 in FIG. 7, the output power $P_{out}$ of the transistor 1 decreases with variations in the input power $P_{in}$. When the operating point 13 of the transistor 1 moves toward the lower right side of FIG. 2, gate current flows from the drain bias terminal 8 to the gate bias terminal 7 through the transistor 1. At this time, the minus gate bias $V_{gb}$ of the transistor 2 becomes shallow due to the voltage drop across the resistors 3 and 4, and the operating point of the transistor 2 moves from the vicinity of a region 15 to the vicinity of a region 14 as shown in FIG. 3. Thereby, the gate bias $V_{gb}$ of the transistor 2 exceeds the pinch-off voltage $V_p$ of the transistor 2, so that the transistor 2 starts operating. Consequently, both of the transistors 1 and 2 operate at high input power, and the reduced output power of the transistor 1 is compensated by the operation of the transistor 2, whereby the conventional characteristic 16 shown in FIG. 4 is changed to the characteristic 17 according to the first embodiment the output power is constant.

As described above, in the power amplifier according to the first embodiment, the transistors 1 and 2 having the same pinch-off voltage are connected in parallel between the input matching circuit 9 and the output matching circuit 10, the resistors 3 and 4 are connected to the gates of the transistors 2 and 1, respectively, and the gates of the transistors 1 and 2 are grounded through the resistor 5. The resistance values of the resistors 3, 4 and 5 are set as follows. In a region of the power characteristic of the transistor where the output power increases proportionally to an increase in the input power, i.e., in the low input power state, the gate bias $V_{ga}$ applied to the transistor 1 exceeds the pinch-off voltage $V_p$ of the transistor 1 and the transistor 1 is in the ON state, and the gate bias $V_{gb}$ applied to the transistor 2 does not exceed the pinch-off voltage $V_p$ of the transistor 2 and the transistor 2 is in the OFF state. In the vicinity of a region of the power characteristic of the transistor where the output power is maximum, i.e., in the high input power state, the gate bias $V_{gb}$ applied to the transistor 2 exceeds the pinch-off voltage $V_p$ of the transistor 2, and both of the transistors 1 and 2 are in the ON state. Therefore, both of the transistors 1 and 2 operate at the high input power, whereby the reduced output power of the transistor 1 is compensated by the operation of the transistor 2. Consequently, the output power is constant even at the high input power. As a result, a power amplifier that can produce constant output power level with respect to a wide range of input power levels can be obtained.

Embodiment 2.

A power amplifier according to a second embodiment of the present invention has the same circuit construction as in the first embodiment, except that the resistance values $R_a$, $R_b$ and $R_c$ of the resistors 3, 4 and 5 are set to 300 Ω, 400Ω and 180Ω, respectively.

Figure 5:
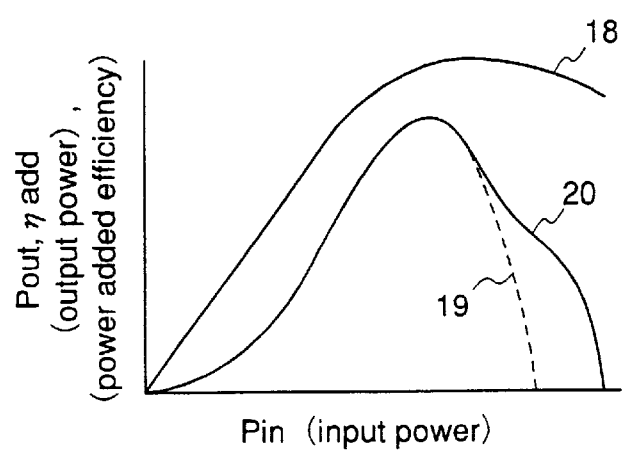
FIG. 5 is a graph showing input power and output power characteristics and power added efficiency characteristics of power amplifiers according to second and fourth embodiments of the present invention.

As described above, the resistance values $R_a$, $R_b$ and $R_c$ of the resistors 3, 4 and 5 that are connected to the gates of the transistors 1 and 2 are set to large values. Therefore, when the input power $P_{in}$ exceeds a region where the output power $P_{out}$ is maximum, i.e., when the input power $P_{in}$ is excessive, the gate current flowing from the drain bias terminal 8 to the gate bias terminal 7 through the transistor 1 in the ON state is suppressed, whereby loss of the power at the drain bias is prevented. Consequently, in the power amplifier according to the second embodiment, the conventional characteristic 19 shown in FIG. 5 is changed to the characteristic 20 according to the second embodiment, resulting in a high value of a power added efficiency even when the input power $P_{in}$ is excessive.

Embodiment 3.

Figure 6:
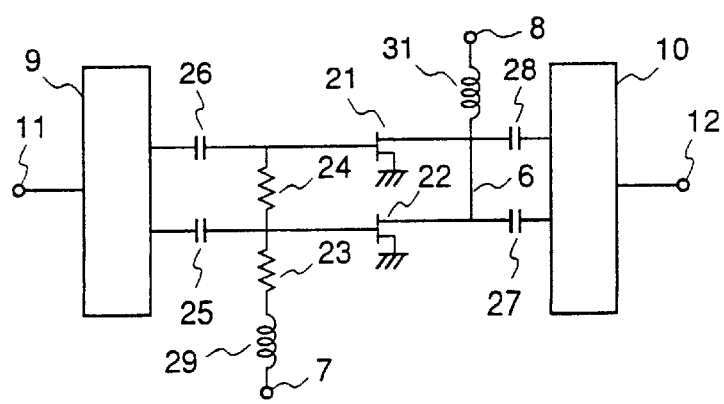
FIG. 6 is a circuit diagram illustrating a power amplifier according to a third embodiment of the present invention.

FIG. 6 is a circuit diagram illustrating a power amplifier according to a third embodiment of the present invention.

As shown in FIG. 6, the power amplifier according to the third embodiment includes an input matching circuit 9, an output matching circuit 10, and two transistors 21 and 22 that are connected in parallel between the matching circuits 9 and 10. The transistors 21 and 22 have different pinch-off voltages.

The gates of the transistors 21 and 22 are connected to resistors 24 and 23, respectively. An end of the resistor 23 is connected to an end of the resistor 24, and the other end of the resistor 23 is connected to a gate bias terminal 7. A coil 29 for cutting off RF components is connected between the resistor 23 and the gate bias terminal 7. Further, the gates of the transistors 21 and 22 are connected to the input matching circuit 9. Capacitors 25 and 26 for cutting off DC components in the gate biases are connected between the transistors 22 and 21 and the input matching circuit 9, respectively. The input matching circuit 9 is connected to an input terminal 11 for supplying an input power.

The drains of the transistors 21 and 22 are connected to a low-resistance wire 6. An end of the low-resistance wire 6 is connected to a drain bias terminal 8. A coil 31 for cutting off RF components is connected between the drain bias terminal 8 and the low-resistance wire 6. Further, the drains of the transistors 21 and 22 are connected to the output matching circuit 10. Capacitors 27 and 28 for cutting off DC components in the drain biases are connected between the transistors 22 and 21 and the output matching circuit 10, respectively. The output matching circuit 10 is connected to an output terminal 12 for outputting an output power.

The sources of the transistors 21 and 22 are respectively grounded.

In addition, the power amplifier with the construction described above is fabricated by laminating desired semiconductor layers on a semiconductor substrate, such as GaAs.

A description is given of the operation of the power amplifier according to the third embodiment, with reference to FIGS. 2 to 4.

Assume that the resistance values of the resistors 23 and 24 are $R_a$ and $R_b$, respectively, and the voltage of the gate bias terminal 7 is $-V_{gg}$. In the power amplifier according to the third embodiment, unlike in the first embodiment, no gates of the transistors are grounded through a resistor. Therefore, at the low input power, the gate currents of the transistors 21 and 22 hardly flow, and the gate biases $V_{ga}$ and $V_{gb}$ of the transistors 21 and 22 are almost equal to the gate bias $-V_{gg}$. Thus, the gate bias $-V_{gg}$ is set to be larger than the pinch-off voltage $V_{pa}$ of the transistor 21 and smaller than the pinch-off voltage $V_{pb}$ of the transistor 22. For example, when the gate bias $-V_{gg}$ is $-2.0$ V, the pinch-off voltage $V_{pa}$ of the transistor 21 is $-2.2$ V, and the pinch-off voltage $V_{pb}$ of the transistor 22 is $-1.8$ V, and the resistance values $R_a$ and $R_b$ of the resistors 23 and 24 are set to 20 k$\Omega$ and 10 k$\Omega$, respectively. At this time, the operating point of the transistor 21 is present in the vicinity of a region 13 shown in FIG. 2. The operating point of the transistor 22 is present in the vicinity of a region 14 shown in FIG. 3. Accordingly, the transistor 21 is in the ON state and the transistor 22 is in the OFF state.

At the high input power, as in the first embodiment, the gate bias $V_{gb}$ of the transistor 22 exceeds the pinch-off voltage $V_{pb}$ of the transistor 22, so that the transistor 22 starts operating. Consequently, both of the transistor 21 and the transistor 22 operate at the high input power, and the reduced output power of the transistor 21 is compensated by the operation of the transistor 22, whereby the conventional characteristic 16 shown in FIG. 4 is changed to the characteristic 17 according to the third embodiment in which the output power is constant.

As described above, in the power amplifier according to the third embodiment, the transistors 21 and 22 having different pinch-off voltages are connected in parallel between the input matching circuit 9 and the output matching circuit 10, and the resistors 23 and 24 are connected to the gates of the transistors 22 and 21, respectively. The resistance values of the resistors 23 and 24 are set as follows. In a region of the power characteristic of the transistor where the output power increases proportionally to an increase in the input power, i.e., in the low input power state, the gate bias $V_{ga}$ applied to the transistor 21 exceeds the pinch-off voltage $V_{pa}$ of the transistor 21 and the transistor 21 is in the ON state, and the gates bias $V_{gb}$ applied to the transistor 22 does not exceed the pinch-off voltage $V_{pb}$ of the transistor 22 and the transistor 22 is in the OFF state. In the vicinity of a region of the power characteristic of the transistor where the output power is maximum, i.e., in the high input power state, the gate bias $V_{gb}$ applied to the transistor 22 in the OFF state exceeds the pinch-off voltage $V_{pb}$ of the transistor 22, and both of the transistors 21 and 22 are in the ON state. Therefore, both of the transistor 21 and the transistor 22 operate at the high input power, whereby the reduced output power of the transistor 21 is compensated by the operation of the transistor 22. Consequently, the output power is constant even at the high input power. As a result, a power amplifier that can produce constant output power level with respect to a wide range of input power levels can be obtained.

Embodiment 4.

A power amplifier according to a fourth embodiment of the present invention has the same circuit construction as in the third embodiment, except that the resistance values $R_a$ and $R_b$ of the resistors 23 and 24 are set to 300$\Omega$ and 400$\Omega$, respectively.

As described above, the resistance values $R_a$ and $R_b$ of the resistors 23 and 24 that are connected to the gates of the transistors 21 and 22 are set to large values. Therefore, when the input power exceeds a region where the output power is maximum, i.e., when the input power is excessively input, the gate current flowing from the drain bias terminal 8 to the gate bias terminal 7 through the transistor 1 in the ON state is suppressed, whereby loss of power at the drain bias is prevented. Consequently, in the power amplifier according to the fourth embodiment, the conventional characteristic 19 shown in FIG. 5 is changed to the characteristic 20 according to the fourth embodiment, resulting in a high power added efficiency even when the input power is excessive.

What is claimed is:

1. A power amplifier including:

an input matching circuit;

an output matching circuit;

first and second transistors having respective gates connected to said input matching circuit and respective drains connected to said output matching circuit, a gate bias being applied to the gates of said first and second transistors and a drain bias being applied to the drains of said first and second transistors, said first and second transistors amplifying an input power supplied from said input matching circuit and transmitting an amplified power to said output matching circuit as an output power, wherein at least two said first and second transistors have the same pinch-off voltage and are connected in parallel;

first and second resistors connected to said gates of said first and second transistors, said gate of said first transistor being connected to ground through said first resistor and said gate of said second transistor being connected to ground through said first and second resistors serially, wherein said first and second resistors have resistances so that in an operating region of said first and second transistors where output power increases proportionally to input power, the gate bias applied to said first transistor exceeds the pinch-off voltage so that said first transistor is in an ON state, and the gate bias applied to said second transistor does not exceed the pinch-off voltage so that said second transistor is in an OFF state, and in an operating region of said first transistor where the out-put power does not increase proportionally to input power, the gate bias applied to said second transistor exceeds the pinch-off voltage so that both of said first and second transistors are in the ON state.

2. The power amplifier of claim 1, wherein said first and second resistors have respective resistances so that when the input power exceeds a threshold input power, a gate current flowing from said drain to said gate through said first and second transistors is suppressed.

3. A power amplifier including an input matching circuit;

an output matching circuit;

first and second transistors having respective gates connected to said input matching circuit and respective drains connected to said output matching circuit, a gate bias being applied to the gates of said first and second transistors and a drain bias being applied to the drains of said first and second transistors, said first and second transistors amplifying an input power supplied from said input matching circuit and transmitting an amplified power to said output matching circuit as an output power, wherein said first and second transistors have different pinch-off voltages and are connected in parallel;

first and second resistors connected to said gates of said first and second transistors, said gate of said first transistor being connected to the gate bias through said first resistor and said gate of said second transistor being connected to the gate bias through said first and second resistors serially, wherein said first and second resistors having resistances so that in an operating region of said first and second transistors where output power increases proportionally to input power, the gate bias applied to said first transistor exceeds the pinch-off voltage of said first transistor so that said first transistor is in an ON state, and the gate bias applied to said second transistor does not exceed the pinch-off voltage of said second transistor so that said second transistor is in an OFF state, and in an operating region of said first transistor where the out-put power does not increase proportionally to input power, the gate bias applied to said second transistor exceeds the pinch-off voltage of said second transistor so that both of said first and second transistors are in the ON state.

4. The power amplifier of claim 3, wherein said first and second resistors have respective resistances so that when the input power exceeds a threshold input power, a gate current flowing from said drain to said gate through said first and second transistors is suppressed.

* * * * *